(12) United States Patent
Chiang et al.

(10) Patent No.: US 8,981,332 B2
(45) Date of Patent: Mar. 17, 2015

(54) NONVOLATILE RESISTIVE MEMORY ELEMENT WITH AN OXYGEN-GETTERING LAYER

(71) Applicant: Intermolecular Inc., San Jose, CA (US)

(72) Inventors: Tony P. Chiang, Campbell, CA (US); Dipankar Pramanik, Saratoga, CA (US); Milind Weling, Pleasanton, CA (US)

(73) Assignee: Intermolecular, Inc., San Jose, CA (US)

( * ) Notice: Subject to any disclaimer, the term of this patent is extended or adjusted under 35 U.S.C. 154(b) by 78 days.

(21) Appl. No.: 13/838,640

(22) Filed: Mar. 15, 2013

(65) Prior Publication Data

US 2014/0268993 A1    Sep. 18, 2014

(51) Int. Cl.
  *H01L 47/00*    (2006.01)
  *G11C 13/00*    (2006.01)

(52) U.S. Cl.
  CPC .................................. *G11C 13/0002* (2013.01)
  USPC ................ 257/4; 257/E23.137; 257/E21.318; 438/104; 438/648; 438/656

(58) Field of Classification Search
  None
  See application file for complete search history.

(56) References Cited

U.S. PATENT DOCUMENTS

| | | |
|---|---|---|
| 2007/0131278 A1 | 6/2007 | Liu |
| 2009/0065760 A1* | 3/2009 | Lee et al. ............................ 257/4 |
| 2010/0038791 A1 | 2/2010 | Lee |
| 2010/0065803 A1 | 3/2010 | Choi |
| 2010/0258782 A1* | 10/2010 | Kuse et al. .......................... 257/4 |
| 2011/0207280 A1 | 8/2011 | Ando |
| 2012/0021597 A1 | 1/2012 | Araya |
| 2012/0091427 A1* | 4/2012 | Chen et al. .......................... 257/5 |
| 2012/0098047 A1 | 4/2012 | Brewer |
| 2012/0178210 A1 | 7/2012 | Lee |
| 2013/0056700 A1 | 3/2013 | Wang |

OTHER PUBLICATIONS

Park, Jae-Wan., et al.; Influence of Oxygen Content on Electrical Properties of NiO Films Grown by Rf Reactive Sputtering for Resistive RandomAccess Memory Applications; Jan. 1, 2006; Academia—Hanyang University; Journal of Vacuum Science and Technology A. 23 5m oo 22052208.

Frank, Martin M; Highk Metal Gate Innovations Enabling Continued CMOS Scaling; Jan. 1, 2011; IEEE; IBM T.J. Watson research Center.

Grubbs, Melody et al.; Development and characterization of high temperature stable TaWSiC amorphous metal gates; Jan. 1, 2010; Applied Physics; Applied Physics letters 97.

Seo, S.-C, et al.; Full Metal Gate with Borderless Contact for 14 nm and Beyond; Jan. 1, 2011; Z—Not Available; IBM T.J. Watson Research Center.

Stumpf, R., et al.; Reduced Oxygen Diffusion Through Beryllium Doped Platinum Electrodes; Sep. 6, 1999; American Institute of Physics; Applied Physics Letters vol. 75 No. 10 pp. 13891391.

* cited by examiner

*Primary Examiner* — David Vu
*Assistant Examiner* — Cuong B Nguyen

(57) ABSTRACT

A nonvolatile resistive memory element includes an oxygen-gettering layer. The oxygen-gettering layer is formed as part of an electrode stack, and is more thermodynamically favorable in gettering oxygen than other layers of the electrode stack. The Gibbs free energy of formation ($\Delta fG°$) of an oxide of the oxygen-gettering layer is less (i.e., more negative) than the Gibbs free energy of formation of an oxide of the adjacent layers of the electrode stack. The oxygen-gettering layer reacts with oxygen present in the adjacent layers of the electrode stack, thereby preventing this oxygen from diffusing into nearby silicon layers to undesirably increase an $SiO_2$ interfacial layer thickness in the memory element and may alternately be selected to decrease such thickness during subsequent processing.

10 Claims, 6 Drawing Sheets

NONVOLATILE RESISTIVE MEMORY ELEMENT WITH AN OXYGEN-GETTERING LAYER

BACKGROUND

1. Field of the Invention

This invention relates to nonvolatile resistive memory elements, and more particularly, to a nonvolatile resistive memory element with an oxygen-gettering layer.

2. Description of the Related Art

Nonvolatile memory elements are used in devices requiring persistent data storage, such as digital cameras and digital music players, as well as in computer systems. Electrically-erasable programmable read only memory (EPROM) and NAND flash are nonvolatile memory technologies currently in use. However, as device dimensions shrink, scaling issues pose challenges for traditional nonvolatile memory technology. This has led to the investigation of alternative nonvolatile memory technologies, including resistive switching nonvolatile memory.

Resistive-switching-based nonvolatile memory is formed using memory elements that are bistable, i.e., having two stable states with different resistances. A bistable memory element can be placed in a high resistance state or a low resistance state by application of suitable voltages or currents. Voltage pulses are typically used to switch the bistable memory element from one resistance state to the other. Subsequently, nondestructive read operations can be performed on the memory element to ascertain the value of a data bit that is stored therein.

As resistive switching memory device sizes are scaled downward in size, it is important to reduce the required forming voltage for devices as well as switching current and voltage, i.e., the current and voltage that are necessary to reliably set, reset and/or determine the desired "on" and "off" states of the device. Reduction of the switching voltage and current minimizes power consumption of the device, resistive heating of the device, and cross-talk between adjacent devices.

In resistive switching devices that use a silicon dioxide ($SiO_2$) layer together with a high-K dielectric layer to perform resistive switching, the thickness of the silicon dioxide layer strongly affects the required forming voltage, switching current, and switching voltage of the device. If the silicon dioxide layer in a resistive switching device is too thick, the forming voltage, switching current, and switching voltage of the device are undesirably high. If the silicon dioxide layer in the resistive switching device is too thin, bistable switching may not occur reliably.

In light of the above, there is a need in the art for nonvolatile resistive switching memory devices that have a silicon dioxide layer that is neither too thick nor too thin.

SUMMARY

Embodiments according to the invention set forth a ReRAM nonvolatile memory element that includes a novel oxygen-gettering layer and methods of forming the same. The oxygen-gettering layer is formed as part of an electrode stack, and its constituents are selected to be more thermodynamically favorable in gettering oxygen than other layers of the top electrode stack. In some embodiments, the Gibbs free energy of formation ($\Delta_f G°$) of an oxide of the oxygen-gettering layer is less (i.e., more negative) than the Gibbs free energy of formation of an oxide of the surrounding layers of the electrode stack. In such embodiments, the oxygen-gettering layer reacts with oxygen present in the surrounding layers of the electrode stack, thereby preventing this oxygen from diffusing into nearby silicon layers and increasing the thickness of an $SiO_2$ interfacial layer. In some embodiments, the Gibbs free energy of formation of an oxide of the oxygen-gettering layer is less than the Gibbs free energy of formation of $SiO_2$ in the interfacial layer of the nonvolatile memory element, so that the thickness of the interfacial layer can be reduced to a desired thickness with a thermal anneal process.

In some embodiments, a nonvolatile memory element comprises a first electrode layer, a resistive switching layer that includes an interfacial layer and a dielectric layer, and a second electrode layer. The interfacial layer is disposed adjacent to the first electrode layer and includes an oxide, and the dielectric layer is disposed adjacent to the interfacial layer and comprises a material having a dielectric constant of at least about 4.0. The second electrode layer is disposed adjacent to the dielectric layer and comprises a first metal layer, a second metal layer, and an oxygen-gettering layer disposed between the first metal layer and the second metal layer, wherein the oxygen-gettering layer includes an oxygen-gettering material.

In other embodiments, a nonvolatile memory element comprises a first electrode layer, a resistive switching layer that includes a dielectric layer and an interfacial layer, and a second electrode layer. The dielectric layer is disposed adjacent to the first electrode layer and comprises a material having a dielectric constant of at least about 4.0. The interfacial layer is disposed adjacent to the dielectric layer and includes an oxide, an oxygen-gettering layer that is disposed adjacent to the interfacial layer and comprises an oxygen-gettering material, and a second electrode layer that is disposed adjacent to the oxygen-gettering layer.

BRIEF DESCRIPTION OF THE DRAWINGS

So that the manner in which the above recited features of embodiments can be understood in detail, a more particular description of embodiments, briefly summarized above, may be had by reference to the appended drawings. It is to be noted, however, that the appended drawings illustrate only typical embodiments and are therefore not to be considered limiting in scope.

For clarity, identical reference numbers have been used, where applicable, to designate identical elements that are common between figures. It is contemplated that features of one embodiment may be incorporated in other embodiments without further recitation.

DETAILED DESCRIPTION

Materials used as the switching layer of a nonvolatile resistive memory element are generally required to have bistable electrical switching properties and, ideally, can be operated with low switching current and formed with a minimal forming voltage. A nonvolatile memory element with a variable resistance layer and a novel oxygen-gettering layer, and methods of forming the same, are described. The novel variable resistance layer has bistable resistance properties and includes a high-K dielectric layer and a silicon dioxide ($SiO_2$) interfacial layer. The novel oxygen-gettering layer includes an oxygen-gettering material that can prevent unwanted growth and/or reduce the thickness of the interfacial layer during fabrication of the memory element.

Figure 1:
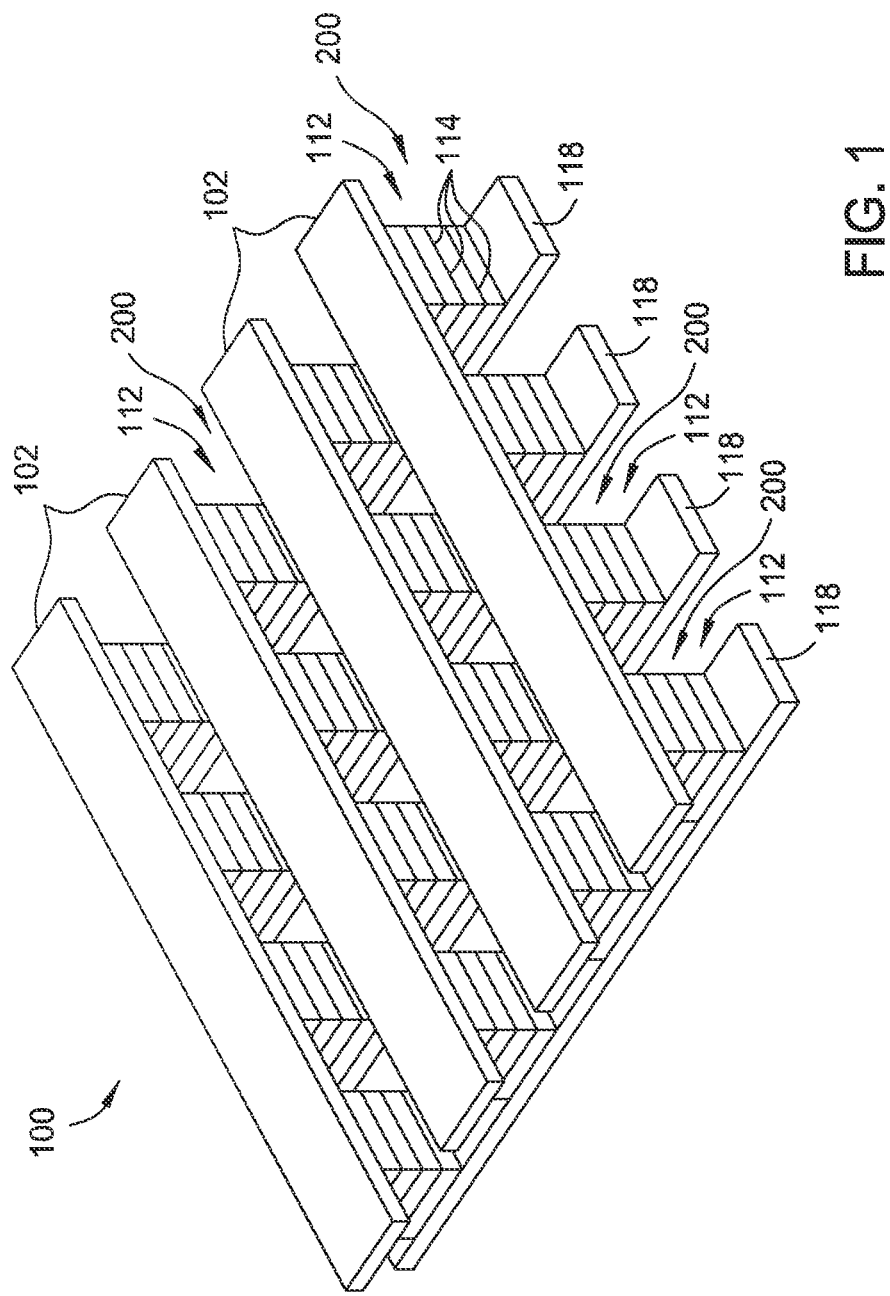
FIG. 1 is a perspective view of a memory array of memory devices, configured according to embodiments described herein.

FIG. 1 is a perspective view of a memory array 100 of memory (elements) devices 200. Memory array 100 may be part of a larger memory device or other integrated circuit structure, such as a system-on-a-chip type device. Memory array 100 may be formed as part of a high-capacity nonvolatile memory integrated circuit, which can be used in various electronic devices, such as digital cameras, mobile telephones, hand-held computers, and music players. For clarity, memory array 100 is illustrated as a single layer memory array structure. However, memory arrays such as memory array 100 can also be stacked to make multilayer memory array structures.

Each of memory devices 200 comprises a nonvolatile resistive switching memory device, such as a resistive random access memory (ReRAM) device. Memory device 200 comprises a novel memory element 112 that may be formed from one or more material layers 114. Material layers 114 include a variable resistance layer that includes a material that has bistable resistance properties and an oxygen-gettering layer. The variable resistance layer and oxygen-gettering layer are described below in conjunction with FIG. 4. In some embodiments, memory device 200 also includes a current steering device, which is described below in conjunction with FIGS. 2A and 2B.

Read and write circuitry (not shown) is connected to memory devices 200 using electrodes (or electrode assemblies) 102 and electrodes (or electrode assemblies) 118. Electrodes 102 and electrodes 118, which are sometimes referred to as "bit lines" and "word lines," are tied together for multiple cells or an array via interconnects and are used to read and write data into memory elements 112 in memory devices 200. An individual memory device 200 or groups of memory devices 200 can be addressed using appropriate sets of electrodes 102 and electrodes 118.

Figure 2A:
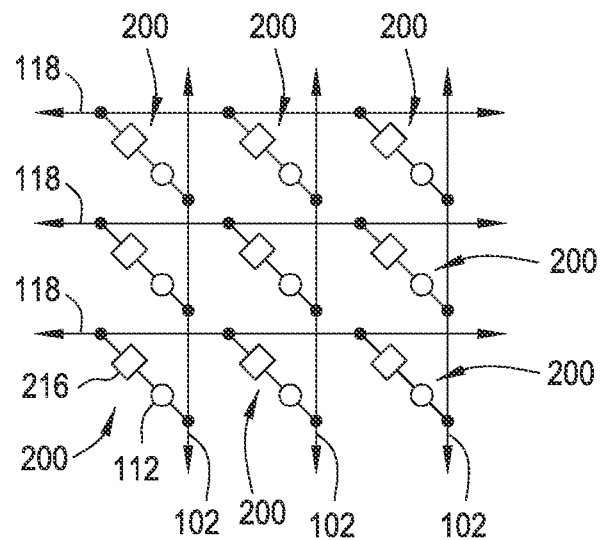
FIG. 2A schematically illustrates, according to some embodiments, a memory array having a plurality of memory devices connected together to form part of a high-capacity nonvolatile memory array that, together with memory read and write circuitry and other peripheral devices, constitutes a memory chip.

FIG. 2A schematically illustrates, according to some embodiments, memory array 100 having a plurality of memory devices 200 connected together to form part of a high-capacity nonvolatile memory array that, together with memory read and write circuitry and other peripheral devices, constitutes a memory chip. In accordance with some embodiments, each of the memory devices 200 may include one resistive switching memory element 112 and one current steering element 216 (e.g., a diode-type current steering device) that are connected to at least one of the electrodes 102 and at least one of the electrodes 118. Each of the memory devices 200 can be accessed individually using appropriate sets of discrete word-lines and bit-lines, which comprise at least a portion of the electrodes 102 and 118. In other embodiments, memory devices 200 may be configured without current steering element 216.

In some embodiments, current steering device 216 may include two or more layers of semiconductor material, such as two or more doped silicon layers, that are configured to allow or inhibit the current flow in different directions through the memory element 112. In addition, read and write circuitry (not shown) is coupled to memory device 200 via electrodes 102 and electrodes 118 as shown. Generally, such read and write circuitry is configured to both sense the resistance state and set the resistance state of memory device 200.

Figure 2B:
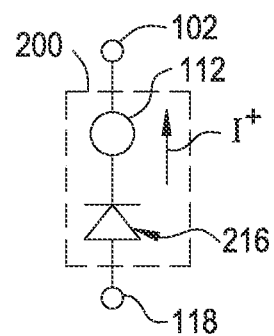
FIG. 2B schematically illustrates a memory device configured to allow current to flow through the memory device in a forward direction.

FIG. 2B schematically illustrates memory device 200 configured to allow current to flow through memory device 200 in a forward direction ("I$^+$"). However, a reduced current can also flow in the opposing direction through the device by the application of a reverse bias to electrodes 102 and electrodes 118.

Figure 3:
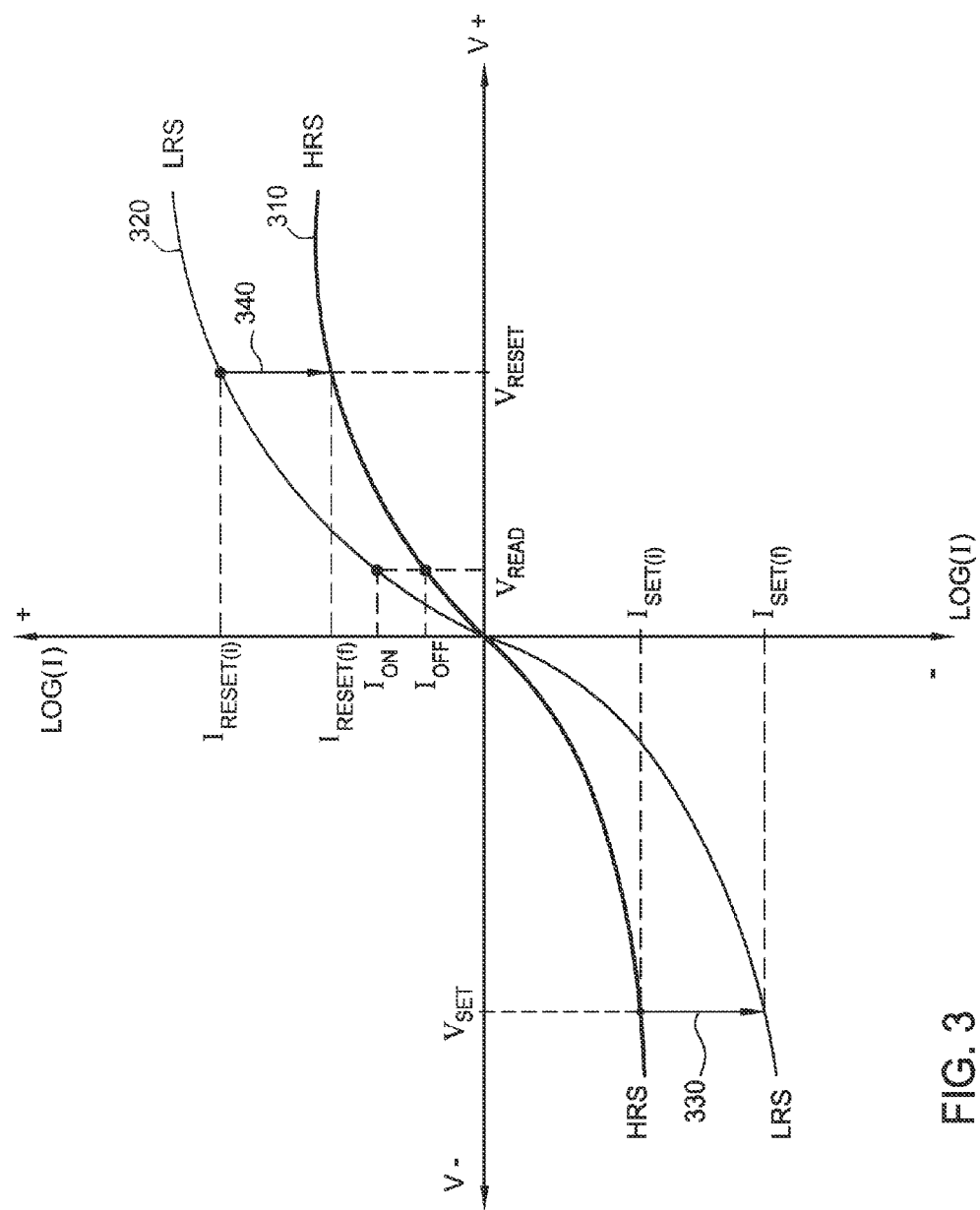
FIG. 3 schematically illustrates exemplary plots of measured log current (I) values versus applied voltages (V) of exemplary embodiments of a memory device having a resistive switching memory element.

FIG. 3 schematically illustrates exemplary plots of measured log current (I) values versus applied voltages (V) of exemplary embodiments of memory device 200 having a resistive switching memory element 112. The resistive switching memory element may be placed in two stable resistance states: a low-resistance-state (LRS), following the I-V curve of a LRS curve 320, or a high-resistance-state (HRS), following the I-V curve of a HRS curve 310.

In general, by sweeping the voltage applied to the electrode 102 and 118 between two applied voltages (e.g., between $V_{SET}$ (e.g., −3 volts) and $V_{RESET}$ (e.g., +4 volts)) while memory device 200 is in the low resistance state, the LRS curve 320 is obtained. On the other hand, by sweeping the voltage applied to the electrode 102 and 118 between two applied voltages (e.g., between $V_{SET}$ and $V_{RESET}$) while memory device 200 is in the high resistance state, the HRS curve 310 is obtained. Accordingly, resistive switching memory element 112 may either be in a high resistance state (HRS) or a low resistance state (LRS). Resistive switching memory element 112 within memory device 200 can be selectively chosen by read-and-write circuitry for memory array 100 to switch between its resistance states. Current steering element 216 is used to regulate current (e.g., allow or inhibit, etc.) so that current will flow through only the desired memory cells when the appropriate set of word-lines and bit-lines and/or electrodes are selected.

During a "set" operation, because of the physical and electrical characteristics of a variable resistance layer included in material layers 114 (shown in FIG. 1), resistive switching memory element 112 of memory device 200 can switch from the HRS to the LRS (e.g., following the path of an arrow 330), when a "set" switching pulse (e.g., a pulse at $V_{SET}$ voltage level) is applied and delivered through the memory device. By applying the "set" switching pulse to memory device 200, the current flowing through memory device 200 can shift from the initial "set" current level, $I_{SET(i)}$, to the final "set" current level, $I_{SET(f)}$, according to the arrow 330, due to the change in the resistance of the variable resistance layer included in material layers 114.

In addition, during a "reset" operation, the variable resistance layer of memory device 200 can function to switch from the LRS to the HRS (e.g., following the path of arrow 340), when a "reset" switching pulse (e.g., a pulse at $V_{RESET}$ voltage level) is delivered to memory device 200. The current flowing through memory device 200 can shift from the initial "reset" current level, $I_{RESET(i)}$, to the final "reset" current level, $I_{RESET(f)}$, due to the change in the resistance of the variable resistance layer in memory device 200.

During a read operation, the logic state of resistive switching memory element 112 in memory device 200 can be sensed by applying a sensing voltage (i.e., a "read" voltage $V_{READ}$ as shown in FIG. 3, (e.g., applying a sense pulse at about +0.5 to +1.5 volts (V) voltage level)), to an appropriate set of electrodes 102 and 118. Depending on its history, a resistive switching memory element 112 addressed in this way may be either in a high resistance state (HRS) or a low resistance state (LRS). The resistance of resistive switching memory element 112 therefore determines what digital data is being stored by resistive switching memory element 112. If resistive switching memory element 112 is in the low resistance state (LRS), for example, resistive switching memory element 112 may be said to contain a logic one (i.e., a "1" bit). If, on the other hand, resistive switching memory element 112 is in the high resistance state (HRS), resistive switching memory element 112 may be said to contain a logic zero (i.e., a "0" bit).

During a programming operation, the resistive state of a memory element can be changed by application of suitable programming signals to appropriate sets of the electrodes 102 and 118. In some examples, initially, resistive switching memory element 112 may be in a high resistance state (e.g., storing a logic "zero"). The high resistance state (HRS) of resistive switching memory element 112 can be sensed by read circuitry (not shown) for memory array 100 using the electrodes 102 and 118. For example, such read circuitry may apply a read voltage pulse at a $V_{READ}$ voltage level (e.g., +0.5V) to resistive switching memory element 112, and can sense the resulting "off" current level ($I_{OFF}$) that flows through resistive switching memory element 112.

Next, when it is desired to store a logic "one" in memory device 200, resistive switching memory element 112 needs to be placed into its low resistance state (LRS). This may be accomplished by using write circuitry (not shown) for memory array 100 to apply a "set" voltage pulse at a $V_{SET}$ (e.g., −2 V to −4 V) voltage level across the electrodes 102 and 118. In some configurations, applying a negative voltage pulse at a $V_{SET}$ voltage level to resistive switching memory element 112 causes resistive switching memory element 112 to switch to its low resistance state (LRS), following the arrow 330. Resistive switching memory element 112 is changed so that, following the removal of the "set" voltage pulse, $V_{SET}$, resistive switching memory element 112 is characterized to be in a low resistance state (LRS). It is believed that the change in the resistance state of resistive switching memory element 112 may be because the reverse biasing of the device cause traps formed in a variable resistance layer in the memory element to be redistributed or filled (i.e., "trap-mediated") during this process. $V_{SET}$ and $V_{RESET}$ are generally referred to as "switching voltages" herein. The low resistance state (LRS) of the resistive switching memory element can be sensed using the read circuitry for memory array 100. When a read voltage pulse at the $V_{READ}$ level is applied to resistive switching memory element 112, the read circuitry senses the relatively high "on" current value ($I_{ON}$), indicating that resistive switching memory element 112 is in its low resistance state (LRS).

When it is desired to store a logic "zero" in the memory device 200, resistive switching memory element 112 can once again be placed in its high resistance state (HRS) by applying a positive "reset" voltage pulse at a $V_{RESET}$ (e.g., +2 V to +5 V) voltage level to the memory device. When write circuitry for memory array 100 applies $V_{RESET}$ to resistive switching memory element 112, it switches to its high resistance state (HRS), following the arrow 340. When the reset voltage pulse, $V_{RESET}$, is removed from resistive switching memory element 112, resistive switching memory element 112 can once again be tested whether it is in the high resistance state (HRS) by applying a read voltage pulse at the $V_{READ}$ voltage level.

While the discussion of the resistive switching memory element herein primarily provides bipolar switching examples, some embodiments of the resistive switching memory elements may use unipolar switching, where the "set" and "reset" voltage pulses have the same polarity.

It is believed that the change in the resistive state of the memory element 112 may be "trap-mediated," i.e., changes in resistive state are due to the redistribution or filling of traps or defects in a variable resistance layer of memory element 112 when voltage is applied across memory device 200. When the variable resistance layer comprises an oxide, which is sometimes referred to as a host oxide, the defects or traps are generally thought to be oxygen vacancies formed during the deposition and/or the initial "burning-in" (or "forming") of the variable resistance layer. The variable resistance layer of memory element 112, according to embodiments of the invention, may comprise a silicon dioxide ($SiO_2$) interfacial layer and a high-K dielectric layer, formed in contact with each other. In addition to the variable resistance layer, memory element 112 further includes an oxygen-gettering layer that is selected to control the thickness of the silicon dioxide interfacial layer so that said thickness remains in a desired range during fabrication of memory element 112. One such embodiment is illustrated in FIG. 4.

Figure 4:
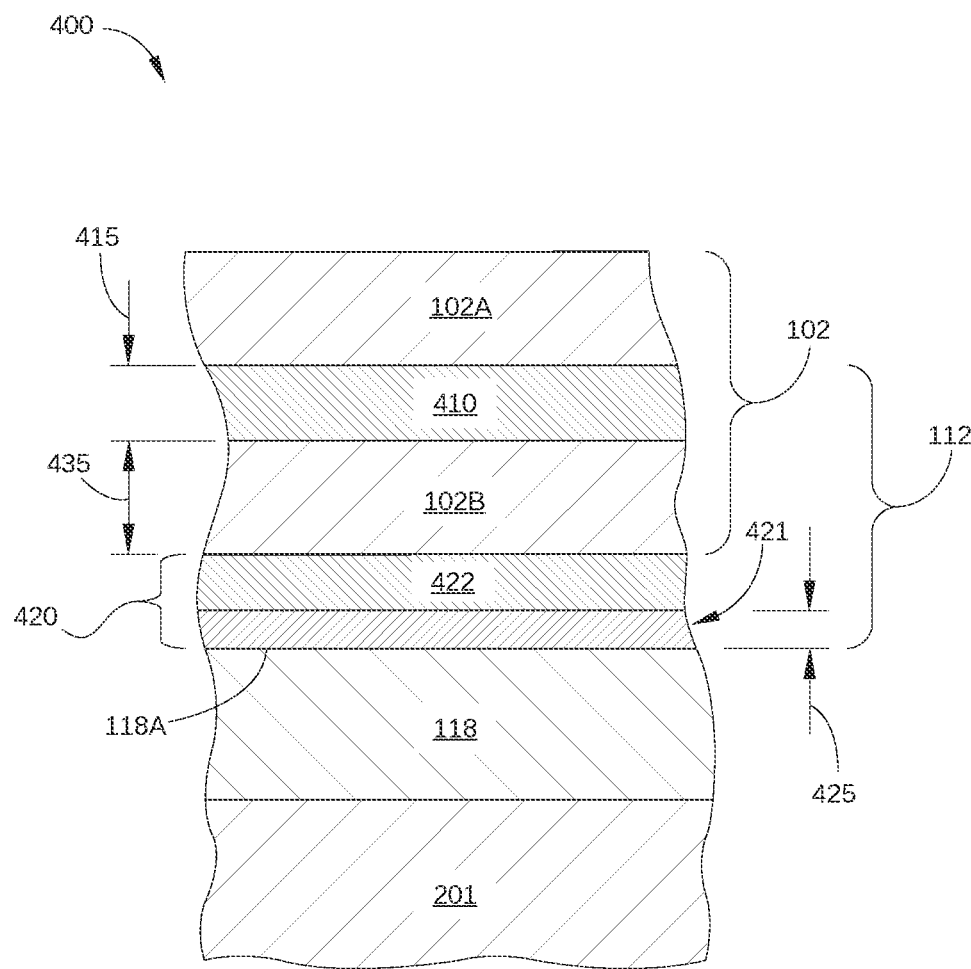
FIG. 4 is a schematic cross-sectional view of a memory device formed using a series of deposited layers, illustrating one embodiment.

FIG. 4 is a schematic cross-sectional view of memory device 400 formed using a series of deposited layers. In the embodiment illustrated in FIG. 4, memory device 400 is formed on, or integrated with and disposed in contact with, portions of a surface of a substrate 201 (e.g., a silicon substrate or an SOI substrate). It is noted that relative directional terms used herein with regard to embodiments are for purposes of description only, and do not limit its scope. Specifically, directional terms such as "on", "over," "above," "under," and the like are used under the assumption that substrate 201 on which embodiments are formed is a "bottom" element and is therefore "under" elements of the structures formed thereon.

In the embodiment illustrated in FIG. 4, memory device 400 comprises a memory element 112 disposed between electrodes 102 (here including 102A, 410, and 102B) and 118. As noted above in conjunction with FIG. 1, the memory element 112 is a nonvolatile resistive memory element, and includes an oxygen-gettering layer 410 (between electrode layers 102A and 102B) and a variable resistance layer 420, each of which is described in greater detail below. Furthermore, in the embodiment illustrated in FIG. 4, the material layers (labeled as layers 114 of memory element 112 in FIG. 1) include portions of electrode 102 and 118.

Electrodes 102 and 118 are formed from conductive materials that have a desirable work function tailored to the bandgap of the material making up variable resistance layer 420. In some configurations, electrodes 102 and 118 are formed from different materials so that electrodes 102 and 118 have a work function that differs by a desired value, e.g., 0.1 eV, 0.5 eV, 1.0 eV, etc. For example, in some embodiments, electrode 102 is comprised of TiN, which has a work function of 4.5-4.6 eV, while electrode 118 can be n-type polysilicon, which has a work function of approximately 4.1-4.15 eV. Other electrode materials suitable for use in electrode 102 and/or electrode 118 include p-type polysilicon (4.9-5.3 eV), transition metals, transition metal alloys, transition metal nitrides, transition metal carbides, tungsten (4.5-4.6 eV), tantalum nitride (4.7-4.8 eV), molybdenum oxide (~5.1 eV), molybdenum nitride (4.0-5.0 eV), iridium (4.6-5.3 eV), iridium oxide (~4.2 eV), ruthenium (~4.7 eV), and ruthenium oxide (~5.0 eV). Other potential electrode materials include titanium/aluminum alloys (4.1-4.3 eV), nickel (~5.0 eV), tungsten nitride (~4.3-5.0 eV), tungsten oxide (5.5-5.7 eV), aluminum (4.2-4.3 eV), copper or silicon-doped aluminum (4.1-4.4 eV), copper (~4.5 eV), hafnium carbide (4.8-4.9 eV), hafnium nitride (4.7-4.8 eV), niobium nitride (~4.95 eV), tantalum carbide (approximately 5.1 eV), tantalum silicon nitride (~4.4 eV), titanium (4.1-4.4 eV), vanadium carbide (~5.15 eV), vanadium nitride (~5.15 eV), and zirconium nitride (~4.6 eV).

In some embodiments, electrode 118 comprises silicon (Si), such as doped polysilicon, and a portion of variable resistance layer 420 is formed on a surface 118A thereof. Specifically, an interfacial layer 421 of variable resistance layer 420 is formed as shown on surface 118A, and comprises silicon dioxide. In some embodiments, interfacial layer 421 is formed as a so-called "native oxide" as a result of exposure to air or any other oxygen source on surface 118A after the deposition of electrode 118. For example, during the fabrication of memory device 200, after the deposition of the polysilicon layer that forms electrode 118, substrate 201 is typically removed from a substrate processing system and is exposed to air, at which point interfacial layer 421 is formed on surface 118A from the silicon of electrode 118. Alternatively, interfacial layer 421 may be formed via a silicon dioxide deposition process, such as chemical vapor deposition (CVD) or atomic layer deposition (ALD), or by processing in a furnace or other oxide-growing reactor.

In embodiments in which interfacial layer 421 is formed as a native oxide, an interfacial layer thickness (shown as 425 in FIG. 4) may be on the order of about 10 Å when first formed as a native oxide, which may be too thick for optimal performance of memory device 400. In some embodiments of memory element 112, interfacial layer thickness 425 is ideally between about 5 Å and 10 Å. Furthermore, subsequent fabrication processes, particularly thermal anneal processes, can cause interfacial layer thickness 425 to increase, since oxygen present in electrode assembly 118, if left unimpeded, can migrate into and react with silicon in electrode 102 during such processes. In some instances, interfacial layer thickness 425 of a native oxide has been observed to increase from approximately 10 Å up to 25 Å or 30 Å after a thermal anneal process. Consequently, memory element 112 includes an oxygen-gettering layer 410 (described below) to prevent such an increase in the interfacial layer thickness 425 and/or to reduce interfacial layer thickness 425 to a desired dimension.

Variable resistance layer 420 is disposed between electrodes 102 and 118 and is configured to perform the switching operations described above in conjunction with FIG. 2. Specifically, variable resistance layer 420 comprises a bistable dielectric material that can be switched between two or more stable resistive states, thereby acting as the switching layer for memory element 112. In addition to interfacial layer 421, variable resistance layer 420 includes a high-k dielectric layer 422 formed adjacent to interfacial layer 421. High-K dielectric layer 422 can have a thickness of between about 10 Å and about 100 Å, depending on the particular configuration and materials present in memory element 112, and has a dielectric constant of at least about 4.0. It is believed that in variable resistance layer 420, interfacial layer 421 acts as the bistable, or resistive switching component, and high-k dielectric layer 422 may act as a buffer material that can provide oxygen vacancies to interfacial layer 421.

A variety of different high dielectric constant materials may be suitable for use as high-K dielectric layer 422, including various oxides, nitrides, and all of the transition metals, i.e., hafnium (Hf), zirconium (Zr), titanium (Ti), tantalum (Ta), and the like. Generally, a material having a high bandgap energy, e.g., greater than 4 electron volts (eV), is desirable, since high band gap variable resistance materials improve data retention and reduce the leakage current of memory element 112. Examples of such high bandgap materials suitable for use in high-K dielectric layer 422 include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). Alternatively, lower bandgap metal oxide materials, such as titanium oxide ($TiO_x$), nickel oxide ($NiO_x$) or cerium oxide ($CeO_x$), may be used advantageously for some configurations of memory element 112. In some cases, a semiconductive metal oxide (p-type or n-type) such as zinc oxides ($Zn_xO_y$), copper oxides ($Cu_xO_y$), and their nonstoichiometric and doped variants can be used. In some embodiments, high-K dielectric layer 422 includes a hafnium-based, metal-rich, non-stoichiometric metal oxide, such as $Hf_xO_y$, $Hf_xSi_yO_z$, HfON, and HfSiON.

Electrode 102 is formed adjacent to variable resistance layer 420 and comprises an electrically conductive material. Suitable materials that may be used to form electrode 102 include metals, metal alloys, metal nitrides or metal carbides formed from an element selected from a group of materials consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combinations thereof.

Because trace oxygen may be present in electrode 102 and may migrate into electrode 118 during thermal processing of memory element 112, memory element 112 includes oxygen-gettering layer 410. As shown, oxygen-gettering layer 410 may be formed as a sub-layer of electrode 102, so that electrode 102 comprises a stack of individually deposited layers. Consequently, in some embodiments, electrode 102 includes electrode layers 102A and 102B, with oxygen-gettering layer 410 disposed therebetween. In one such embodiment, electrode layer 102A and 102B each have a thickness of about 20 Å and 30 Å and oxygen-gettering layer 410 has a thickness 415 of about 10 Å to 20 Å.

Oxygen-gettering layer 410 prevents thickness 425 of interfacial layer 421 from increasing during thermal anneal and other processes. For example, in some embodiments, oxygen-gettering layer 410 includes a material selected to be more thermodynamically favorable in gettering oxygen than electrode layers 102A and 102B. Specifically, the Gibbs free energy of formation ($\Delta_f G°$) of an oxide of the oxygen-gettering material in oxygen-gettering layer 410 is less (i.e., more negative) than the Gibbs free energy of formation of an oxide of the material in electrode layers 102A and 102B. In such embodiments, oxygen-gettering layer 410 reacts with oxygen ions present in the adjacent layers of the electrode stack, thereby preventing those oxygen ions from diffusing into electrode 118, reacting with the silicon material making up electrode 118, and increasing thickness 425 of interfacial layer 421. Specifically, the oxygen atoms present in electrode layers 102A and 102B can diffuse to the interface between electrode 118 and high-k dielectric layer 422 through oxygen vacancies that are present in high-k dielectric layer 422. The driving force for this movement is the decrease in energy of oxygen atoms when moving from electrode 102 to the interfacial layer 421. By placing a layer in immediate contact with electrode 102 that can bind the oxygen atoms, the movement of said oxygen atoms to the interface between electrode 118 and high-k dielectric layer 422 is prevented.

In other embodiments, oxygen-gettering layer 410 includes a material selected to be more thermodynamically favorable in gettering oxygen than silicon. In other words, the Gibbs free energy of formation ($\Delta_f G°$) of an oxide of the oxygen-gettering material in oxygen-gettering layer 410 is less (i.e., more negative) than the Gibbs free energy of formation of silicon dioxide. Consequently, the presence of oxygen-gettering layer 410 in memory element 112 can, during a thermal anneal process, reduce the thickness of interfacial layer 421 by drawing oxygen from interfacial layer 421. Under these conditions, it is energetically more favorable for the oxygen atoms in interfacial layer 421 to be present in oxygen-gettering layer 410 than in interfacial layer 421. Since oxygen atoms are able to diffuse through high-k dielectric layer 422 due to the presence of vacancies therein, the oxygen atoms will move from interfacial layer 421 to oxygen-gettering layer 410, leading to a decrease in interlayer thickness 425. The amount of oxygen that will diffuse is a function of process temperature (which controls the rate of diffusion), anneal time, and thickness of oxygen-gettering layer 410 (which controls the net driving force for the movement of oxygen atoms). By appropriate control of these parameters, modulation of the final thickness of layer 421 is technically feasible.

In embodiments in which oxygen-gettering layer 410 includes a material selected to be more thermodynamically favorable in gettering oxygen than silicon, thickness 435 of electrode layer 102B can be selected to reduce interfacial layer thickness 425 to a desired thickness. Specifically, thickness 435 is selected to mass-limit the reaction by which oxygen-gettering layer 410 reduces the silicon dioxide in interfacial layer 421. In other words, thickness 415 is selected so that oxygen-gettering layer 410 includes a mass of oxygen-gettering material sufficient to reduce interfacial layer 421 to a desired final thickness, but no more.

Alternatively, in embodiments in which oxygen-gettering layer 410 includes a material selected to be more thermodynamically favorable in gettering oxygen than silicon, a time-limited reaction is used to reduce interfacial layer thickness 425. For example, in one embodiment, the time duration of a thermal anneal process in which the reduction of interfacial layer 421 takes place is selected so that interfacial layer thickness 425 is reduced to a desired final thickness by oxygen-gettering layer 410. In such an embodiment, given a known thermal anneal temperature, an oxygen content in electrode layer 102B, and a diffusion constant of oxygen through electrode layer 102B, thickness 435 of electrode layer 102B may be selected to act as a rate-limiting layer that improves process precision and repeatability. For example, as thickness 435 is increased, a process time required to reduce interfacial layer thickness 425 increases, which improves the precision with which interfacial layer thickness 425 can be changed and promotes process repeatability.

As noted above, in some embodiments, oxygen-gettering layer 410 includes a material selected to be more thermodynamically favorable in gettering oxygen than silicon, while in other embodiments, oxygen-gettering layer 410 includes a material selected to be more thermodynamically favorable in gettering oxygen than electrode layers 102A and 102B. Furthermore, in some embodiments, oxygen-gettering layer 410 includes a material selected to be more thermodynamically favorable in gettering oxygen than both silicon and electrode layers 102A and 102B.

In some embodiments, oxygen-gettering layer 410 comprises a metal that forms an oxide that is more stable than silicon dioxide, such as lanthanum (La), magnesium (Mg), titanium (Ti), zirconium (Zr), and hafnium (Hf). The selection of the metal included in oxygen-gettering layer 410 may depend on the material of electrode layers 102A and 102B and the temperature of subsequent fabrication processes used to form memory device 400. For instance, in some embodiments, a metal material for oxygen-gettering layer 410 is selected that does not significantly diffuse through electrode 102B during subsequent fabrication processes. When fabrication of memory device 200 includes relatively high temperature processes, e.g., 600° C. or higher, titanium and/or aluminum in oxygen-gettering layer 410 may diffuse significantly through the material of electrode layer 102B, which can adversely affect the switching behavior of memory device 200. When memory device 200 is formed without such high-temperature processes, titanium and/or aluminum can be used without risk of such diffusion.

In some embodiments, oxygen-gettering layer 410 comprises amorphous silicon. In such embodiments, oxygen-gettering layer 410 can be used to prevent interfacial layer 421 from growing in thickness during subsequent fabrication processes, but generally is not used to reduce interfacial layer thickness 425. Methods currently well-known in the art can be used to form oxygen-gettering layer 410, such as ALD or CVD.

Figure 5:
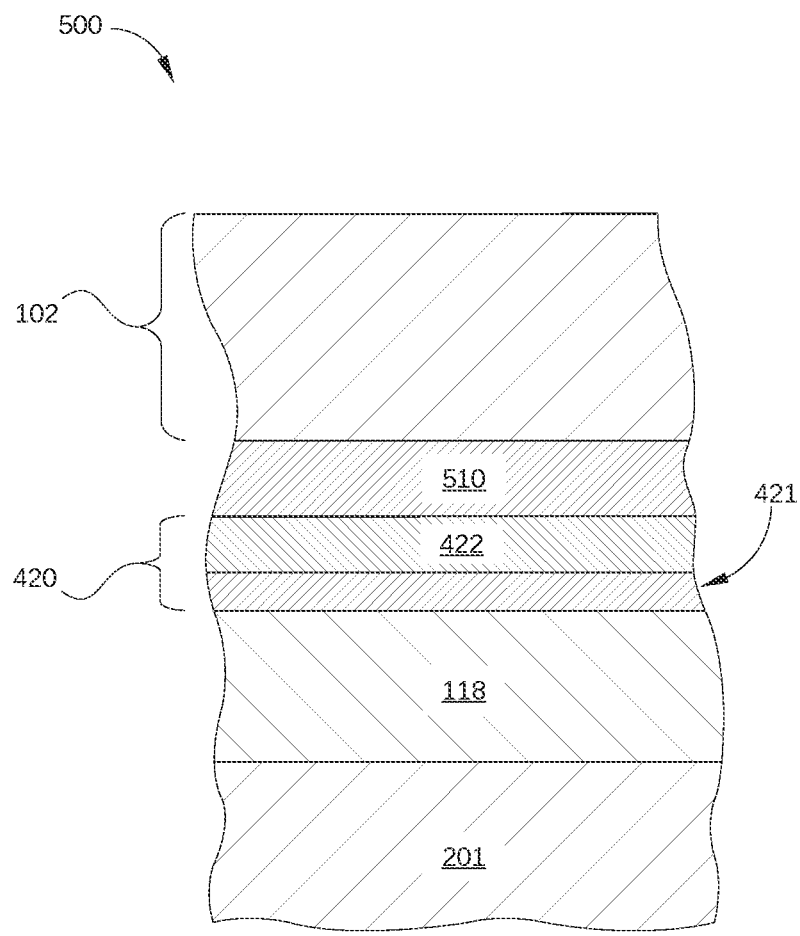
FIG. 5 is a schematic cross-sectional view of a memory device formed using a series of deposited layers, illustrating another embodiment.

In some embodiments, oxygen-gettering layer 410 is not formed as a sub-layer of electrode 102, as depicted in FIG. 4, and is disposed between electrode 102 and high-k dielectric layer 422. One such embodiment is illustrated in FIG. 5. FIG. 5 is a schematic cross-sectional view of a memory device 500 formed using a series of deposited layers. Memory device 500 is substantially similar in configuration and operation to memory device 400 in FIG. 4, except that an oxygen-gettering layer 510 is not formed as part of a sub-layer of electrode 102 and is adjacent to high-k dielectric layer 422.

Because oxygen-gettering layer 510 is formed adjacent to high-k dielectric layer 422, the oxygen-gettering material in oxygen-gettering layer 510 may react with and/or diffuse into high-k dielectric layer 422. Such diffusion or reaction with high-k dielectric layer 422 is generally undesirable, since the switching behavior of memory device 500 can be adversely affected. Moreover, when oxygen-gettering layer 510 is formed adjacent to high-k dielectric layer 422, there is the risk that oxygen-gettering layer 510 may effectively become the top electrode of memory device 500, thereby suppressing the switching behavior of the ReRAM. It is generally held that top electrode 102 should be formed with a material that is not too reactive with oxygen, so that top electrode 102 can act as a storage site for oxygen ions during the "set" operation and as a source of oxygen ions during "reset" operations. Consequently, to avoid oxygen-gettering layer 510 from acting as a poor top electrode 102, i.e., a material that is not too reactive with oxygen, when formed adjacent to high-k dielectric layer 422, in such embodiments, oxygen-gettering layer 510 is preferably formed as an extremely thin layer, i.e., one or two monolayers of atoms.

In some embodiments, a reverse build order is used to form a memory device that includes an oxygen-gettering layer and a variable resistance layer. Specifically, a metallic electrode, such as a TiN electrode, is formed on a substrate, followed by a variable resistance layer and an oxygen-gettering layer, where the oxygen-gettering layer comprises amorphous silicon and an interfacial layer included in the variable resistance layer is formed from a portion of the amorphous silicon included in the oxygen-gettering layer. A second electrode is then formed adjacent to the oxygen-gettering layer. One such embodiment is illustrated in FIG. 6.

Figure 6:
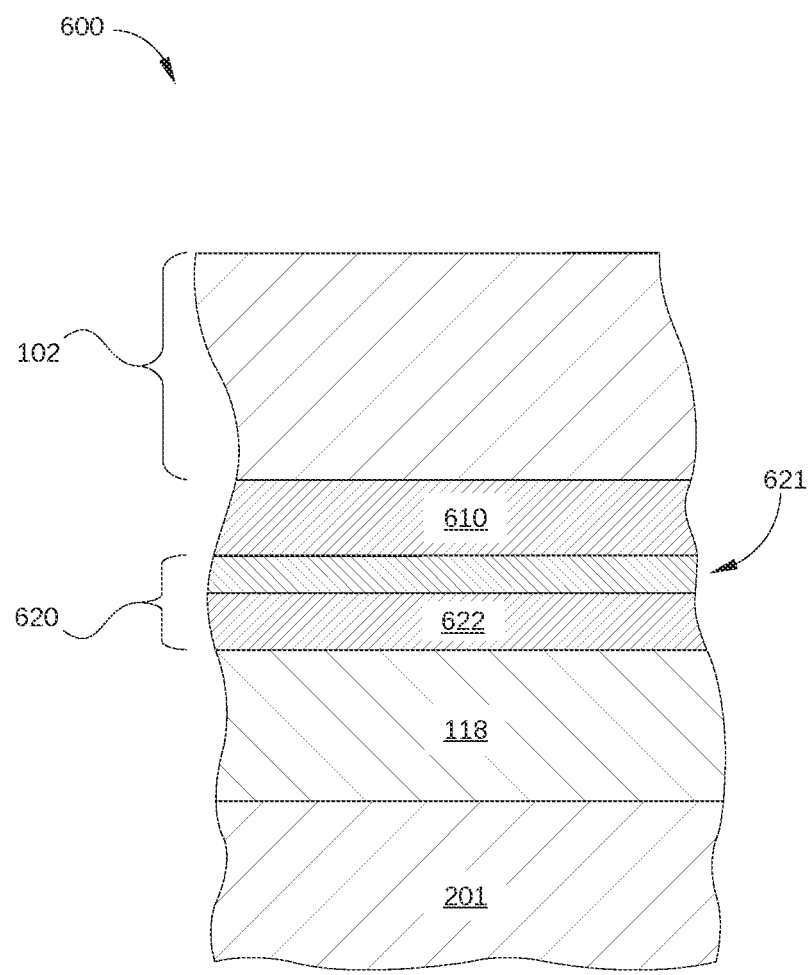
FIG. 6 is a schematic cross-sectional view of a memory device formed using a series of deposited layers, illustrating another embodiment.

FIG. 6 is a schematic cross-sectional view of a memory device 600 formed using a series of deposited layers. Memory device 600 is substantially similar in configuration and operation to memory device 200 in FIG. 2 in that memory device 600 includes a variable resistance layer 620 and an oxygen-gettering layer 610 disposed between electrodes 102 and 118. However, unlike the embodiment of memory device 400 depicted in FIG. 4, a reverse build order of material layers 114 (see FIG. 1) is used in the formation of memory device 600. To that end, electrode 118 comprises a metallic material, such as TiN, rather than silicon, a high-k dielectric layer 622 is formed adjacent to electrode 118, and an interfacial layer 621 is formed from a portion of oxygen-gettering layer 610, as discussed below. High-k dielectric layer 622 may have similar composition to high-k dielectric layer 422 described above in conjunction with FIG. 4.

Oxygen-gettering layer 610 includes silicon, such as amorphous silicon, and is deposited on high-k dielectric layer 622. Unlike interfacial layer 421 in FIG. 4, interfacial layer 621 is not formed as a native oxide. Instead, a portion of oxygen-gettering layer 610 is used to form interfacial layer 621; when oxygen contained in electrode 118 diffuses into oxygen-gettering layer 610 during subsequent high-temperature fabrication processes, such as thermal anneal processes, silicon in oxygen-gettering layer 610 reacts therewith, forming interfacial layer 621. An interfacial layer thickness 625 can be selected by controlling the quantity of oxygen that diffuses into oxygen-gettering layer 610. Factors that can be used to control said quantity of oxygen include oxygen content of electrode 102, thickness of high-k dielectric layer 622 (which can act as an oxygen-diffusion barrier), duration of subsequent thermal anneal processes, and temperature at which such anneal processes are carried out. In some embodiments, oxygen-gettering layer 610 has a thickness 615 of between about 20 Å and 40 Å, and electrode 102 includes a TiN layer that is adjacent to oxygen-gettering layer 610 and has a thickness 616 of between about 20 Å and 30 Å.

While embodiments are described herein in terms of resistive switching memory elements that are used to form memory arrays, embodiments can be applied to other resistive memory devices without deviating from the basic concepts illustrated by the embodiments described herein.

In sum, embodiments provide a nonvolatile resistive memory element having a novel variable resistance layer that includes a novel oxygen-gettering layer and methods of forming the same. The oxygen-gettering layer is formed as part of an electrode stack, and is selected to be more thermodynamically favorable in gettering oxygen than other layers of the top electrode stack. Advantageously, the oxygen-gettering layer reacts with oxygen present in the surrounding layers of the electrode stack, thereby preventing this oxygen from diffusing into nearby silicon layers and increasing the thickness of an $SiO_2$ interfacial layer. In some embodiments, the oxygen-gettering layer can be used to reduce the thickness of the $SiO_2$ interfacial layer to a desired thickness with a thermal anneal process.

While the foregoing is directed to embodiments described, other and further embodiments may be devised without departing from the basic scope thereof, and the scope thereof is determined by the claims that follow.

We claim:

1. A nonvolatile memory element, comprising:
a first electrode layer;
a resistive switching layer; and
a second electrode layer; where
the resistive switching layer comprises an interfacial layer and a dielectric layer;
the interfacial layer is adjacent to the first electrode layer and comprises an oxide;
the dielectric layer is adjacent to the interfacial layer and comprises a material having a dielectric constant of at least about 4.0;
the second electrode layer is adjacent to the dielectric layer and comprises a first metal layer, a second metal layer, and an oxygen-gettering layer; and
the oxygen-gettering layer is between the first metal layer and the second metal layer and comprises an oxygen-gettering material, wherein the oxygen-gettering material comprises silicon.

2. The nonvolatile memory element of claim 1, wherein the Gibbs free energy of formation ($\Delta_f G°$) of an oxide of the oxygen-gettering material is more negative than the Gibbs free energy of formation of an oxide of the first metal layer.

3. The nonvolatile memory element of claim 1, wherein the first electrode layer comprises silicon.

4. The nonvolatile memory element of claim 3, wherein the oxide comprises silicon dioxide.

5. The nonvolatile memory element of claim 1, wherein the dielectric layer comprises a hafnium-based, metal-rich, non-stoichiometric metal oxide.

6. The nonvolatile memory element of claim 5, wherein the dielectric layer includes at least one of $Hf_xO_y$, $Hf_xSi_yO_z$, HfON, and HfSiON.

7. The nonvolatile memory element of claim 1, wherein a quantity of the oxygen-gettering material is selected to achieve a particular interfacial layer thickness during subsequent processing.

8. The nonvolatile memory element of claim 7, wherein the quantity of the oxygen-gettering material is selected to reduce an interfacial layer thickness during subsequent processing.

9. The nonvolatile memory element of claim 7, wherein a thickness of the oxygen-gettering layer is selected to achieve the quantity of the oxygen-gettering material.

10. The nonvolatile memory element of claim 1, wherein an interfacial layer thickness is between about between about 5 Å and 10 Å.

* * * * *